United States Patent
Ana-Lucia et al.

(10) Patent No.: US 12,291,124 B2
(45) Date of Patent: May 6, 2025

(54) METHOD FOR INITIALIZING THE CHARGE STATE OF A BATTERY

(71) Applicants: RENAULT s.a.s., Boulogne-Billancourt (FR); NISSAN MOTOR CO., LTD., Yokohama (JP)

(72) Inventors: Driemeyer Franco Ana-Lucia, Montigny le Bretonneux (FR); Akram Eddahech, Guyancourt (FR)

(73) Assignees: AMPERE S.A.S., Boulogne-Billancourt (FR); NISSAN MOTOR CO., LTD., Yokohama (JP)

( * ) Notice: Subject to any disclaimer, the term of this patent is extended or adjusted under 35 U.S.C. 154(b) by 384 days.

(21) Appl. No.: 17/600,482

(22) PCT Filed: Mar. 24, 2020

(86) PCT No.: PCT/EP2020/058058
§ 371 (c)(1),
(2) Date: Sep. 30, 2021

(87) PCT Pub. No.: WO2020/200897
PCT Pub. Date: Oct. 8, 2020

(65) Prior Publication Data
US 2022/0212563 A1    Jul. 7, 2022

(30) Foreign Application Priority Data
Apr. 3, 2019    (FR) ...................................... 1903547

(51) Int. Cl.
*B60L 58/13*    (2019.01)
*G01R 31/36*    (2020.01)
(Continued)

(52) U.S. Cl.
CPC .......... *B60L 58/13* (2019.02); *G01R 31/3648* (2013.01); *G01R 31/374* (2019.01); *G01R 31/3835* (2019.01)

(58) Field of Classification Search
CPC ... B60L 58/13; G01R 31/3835; G01R 31/374; G01R 31/3648
See application file for complete search history.

(56) References Cited

U.S. PATENT DOCUMENTS

2006/0244458 A1*  11/2006  Cho .................... B60L 58/12
                                                        324/426
2009/0256524 A1   10/2009  Nukui
(Continued)

FOREIGN PATENT DOCUMENTS

EP          2 101 183 A1    9/2009
WO      WO 2006/098594 A1   9/2006

OTHER PUBLICATIONS

International Search Report issued on May 28, 2020 in PCT/EP2020/058058 filed on Mar. 24, 2020, 2 pages.

*Primary Examiner* — Andrew J Cromer
(74) *Attorney, Agent, or Firm* — Oblon, McClelland, Maier & Neustadt, L.L.P.

(57) ABSTRACT

A method for estimating the charge state of a battery includes initializing the charge state, including estimating an initial charge state value. The initializing includes: receiving a stored charge state value for a sleep mode time of the battery, computing a charge state value from a measurement of the no-load voltage at the terminals of the battery at a wake-up time of the battery, and computing an error in the measurement of the no-load voltage due to the relaxation of the battery. The error is computed as a function of the current temperature of the battery and of a target relaxation duration modelled for each temperature. The initial value of the (Continued)

Figure 1:
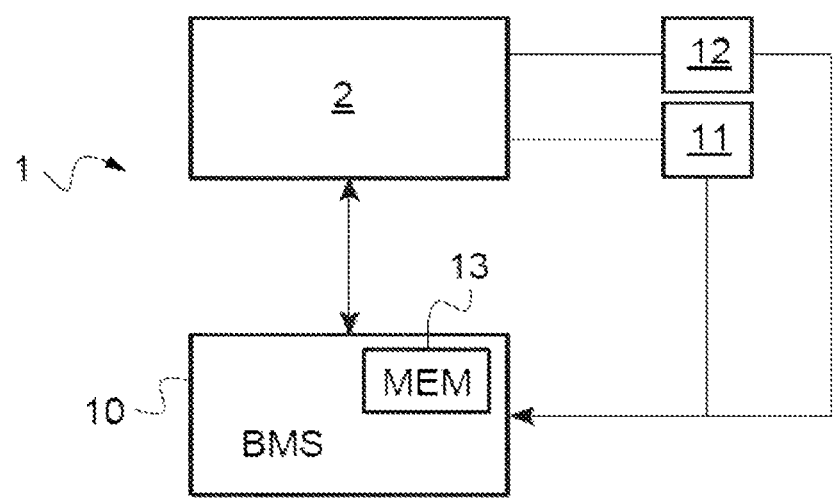

charge state is computed based on a comparison between the recorded and computed charge state values and as a function of the error.

14 Claims, 3 Drawing Sheets

(51) Int. Cl.
    *G01R 31/374*     (2019.01)
    *G01R 31/3835*     (2019.01)

(56) References Cited

U.S. PATENT DOCUMENTS

| | | | |
|---|---|---|---|
| 2010/0010707 A1* | 1/2010 | Izumi | G01R 31/3835 |
| | | | 701/33.7 |
| 2014/0225621 A1 | 8/2014 | Kimura et al. | |
| 2016/0272080 A1 | 9/2016 | Chang et al. | |
| 2017/0106760 A1 | 4/2017 | Wang et al. | |

* cited by examiner

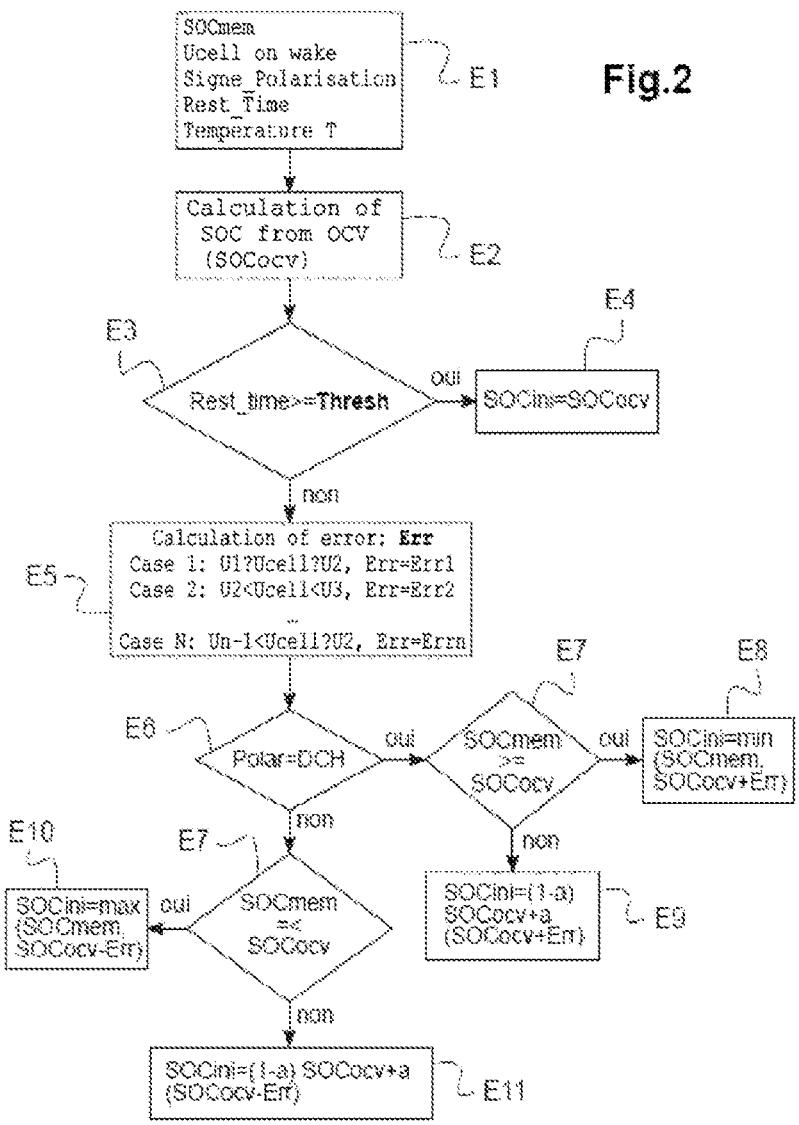

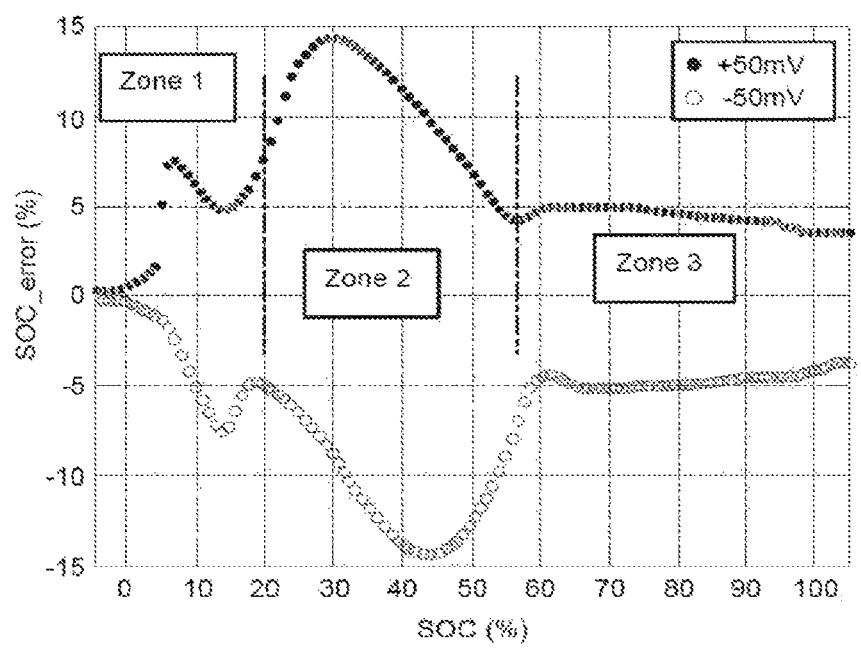

METHOD FOR INITIALIZING THE CHARGE STATE OF A BATTERY

The present invention relates to a method for initializing the charge state of an electrochemical energy storage device, and more specifically an accumulator battery. The invention is notably but not exclusively intended for use in the management of traction batteries for rechargeable hybrid and electric vehicles.

In the domain of hybrid and electric vehicles, one of the main challenges for the management systems of the traction batteries is estimating the state of charge (SOC) of the battery. The state of charge is an essential parameter in the electronic management of a battery. This parameter represents the quantity of electrical energy that an accumulator battery can deliver at a given moment, expressed as a percentage of the nominal capacity thereof. Precisely estimating the state of charge helps to optimize the performance and lifetime of the battery. A known method for determining the state of charge of a battery during operation involves integrating the intensity of the (charging or discharging) current flowing through the battery, as a function of time. In addition to the reliability and robustness of the integrating circuit, the reliability of such a method depends on the initialization phase of the state of charge when the battery wakes. This initialization phase in fact plays an important role in ensuring convergence of the estimates, and therefore the precision of the estimated state of charge.

A method for determining the state of charge of a battery that includes an initialization phase of the estimated state of charge of the battery when the vehicle is started, i.e. when operation of the battery begins, is known from document EP2101183A1. According to this known method, a first state-of-charge value of the battery is calculated from the open-circuit voltage (OCV) of the battery when the vehicle is started, and a second value resulting from the calculation of the state of charge when the vehicle stops, i.e. when operation of the battery stops, is stored in a memory. A comparison is then made between the first calculated state-of-charge value and the second stored state-of-charge value, and the first calculated value is selected as the initial state-of-charge value if the result of the comparison, in absolute terms, is below a threshold, otherwise the second stored value is selected. Thus, if the first value calculated from the open-circuit voltage on starting has a low reliability, the second stored value is defined as the initial state-of-charge value.

However, this method for estimating the initial state-of-charge value of the battery is imprecise in certain usage scenarios, in particular when the battery relaxation time is too short. Conventionally, the charging and/or discharging periods of the battery are separated by periods of relaxation, during which no current is flowing through the battery. After a given relaxation time, the battery reaches a steady state. Once this steady state has been reached, the no-load voltage (open-circuit voltage) can be measured at the terminals of the battery, and this corresponds to the steady-state electromotive force thereof. Depending on the type of battery, a relaxation time of between several minutes and several hours is required to reach steady state. More specifically, the relaxation time required to reach steady state depends on the degree of polarization of the electrodes, which in turn depends notably on the intensity of the current that has flowed through the battery, as well as the application time of said current. Furthermore, any determination of the electromotive force outside steady state affects the precision of the estimate of the state of charge. Since the initialization method of the state of charge according to the aforementioned document takes into consideration neither the polarization of the battery nor the relaxation time of the battery, this method should only be used after a long period of rest of the battery, otherwise the method will be imprecise.

The present invention is therefore intended to provide a method for estimating the initial state of charge value of a battery in a motor vehicle while overcoming the aforementioned limitations.

For this purpose, the invention relates to a method for estimating the state of charge of a battery comprising an initialization phase of the state of charge of the battery that includes estimating an initial value of said state of charge, said initialization phase comprising the following steps:
- reception of a memorized state-of-charge value of the battery when the battery enters sleep mode,
- calculation of a state-of-charge value using a measurement of the no-load voltage at the terminals of the battery when the battery wakes,
- the initialization phase including a calculation step to calculate an error in the measurement of the no-load voltage due to relaxation of the battery, in which said error is calculated as a function of the current temperature of the battery and a target relaxation time of the battery modeled for each temperature,
- the estimate of the initial value of said state of charge being calculated on the basis of a comparison between said memorized and calculated values of the state of charge and as a function of said calculated error.

Such an estimate provides a reliable estimate of the initial state-of-charge value of the battery, enabling the estimate of the state of charge to be reset during relaxation periods, even if said periods are too short for the battery to reach a steady state, as a result of which relaxation of the battery is not ensured.

Advantageously, the calculation of the error caused by relaxation involves:
- memorizing map data correlating a given state of charge with a given no-load voltage of the battery, for a given temperature of the battery,
- determining a maximum error in the measurement of the no-load voltage corresponding to the error between the battery voltage on waking for a minimum relaxation time and the battery voltage on waking for said target relaxation time,
- providing error calibration data describing a variation of a margin of error in the state of charge in relation to a state-of-charge value provided by the map data, as a function of said maximum error,
- calculating said error caused by relaxation using said no-load voltage measurement when the battery wakes and said calibration data.

Advantageously, the estimate of the initial value of said state of charge is calculated as a function of whether the polarization direction corresponds to charging or discharging of the battery when entering sleep mode.

Advantageously, the estimate of the initial value of said state of charge is calculated in consideration of a parameter representing the actual sleeping time of the battery in relation to the target relaxation time of the battery.

Advantageously, if the polarization direction corresponds to discharging when entering sleep mode and the memorized state-of-charge value SOCmem at that instant is equal to or greater than the calculated state-of-charge value SOCocv on waking, the estimate of the initial state-of-charge value SOCini is calculated as follows:

$$SOCini = min(SOCmem, SOCocv + Err),$$

otherwise:

$$SOCini = (1-a) \cdot SOCocv + a \cdot (SOCocv + Err),$$

with the parameter a varying between 0 if the sleeping time of the battery is equal to the target relaxation time of the battery, and 1 if the sleeping time of the battery is equal to the minimum time required between a battery sleep request and a battery wake request.

Advantageously, if the polarization direction corresponds to charging when entering sleep mode and the memorized state-of-charge value SOCmem at that instant is equal to or less than the calculated state-of-charge value SOCocv on waking, the estimate of the initial state-of-charge value SOCini is calculated as follows:

$$SOCini=\max(SOCmem, SOCocv-Err),$$

otherwise:

$$SOCini=(1-a) \cdot SOCocv+a \cdot (SOCocv-Err),$$

with the parameter a varying between 0 if the sleeping time of the battery is equal to the target relaxation time of the battery, and 1 if the sleeping time of the battery is equal to the minimum time required between a battery sleep request and a battery wake request.

In a variant, if the polarization direction corresponds to discharging when entering sleep mode and the memorized state-of-charge value SOCmem at that instant is less than the calculated state-of-charge value SOCocv on waking, the estimate of the initial state-of-charge value SOCini is calculated as follows:

$$SOCini=(SOCocv+(SOCocv+Err))/2.$$

In a variant, if the polarization direction corresponds to charging when entering sleep mode and the memorized state-of-charge value SOCmem at that instant is greater than the calculated state-of-charge value SOCocv on waking, the estimate of the initial state-of-charge value SOCini is calculated as follows:

$$SOCini=(SOCocv+(SOCocv-Err))/2.$$

The invention also relates to a management device for a battery, notably a traction battery of an electric vehicle, characterized in that it includes means for implementing the method described above.

The invention also relates to a rechargeable hybrid or electric motor vehicle, characterized in that it includes a device as described above.

Other features and advantages of the invention are set out in the description provided below as a non-limiting example, with reference to the attached drawings, in which:

FIG. 1 is a schematic view of a management device for a battery designed to implement the method according to the invention, FIG. 2 is a flow chart of the method for initializing the state of charge of the battery in relation to the device in FIG. 1, FIG. 3 shows an example error calibration curve showing the variation in the margin of error in the state of charge caused by relaxation, in relation to the estimated state-of-charge value of the battery on waking.

FIG. 1 shows a device including means for implementing a method according to one embodiment of the invention. The device 1 notably includes a battery management system 10 (BMS). The battery management system 10 is linked to a battery 2. The battery management system is also linked to means 11 for measuring the temperature of the battery and to means for measuring a voltage at the terminals of the battery, said means being known in themselves. The battery management system 10 includes a nonvolatile memory 13 used to store data, in particular data relating to an estimated state of charge of the battery SOCmem and to the polarization of the battery Signe_Polarisation (charging or discharging) when the battery enters sleep mode, the duration of this sleep Rest_time, and the voltage at the terminals of the battery Ucell and the temperature T of the battery when the battery wakes. These data in particular make it possible to judge to state of relaxation of the battery on waking, as explained in greater detail below.

The memory 13 also stores, for example in the form of a map OCV=f(SOC, data relating to the correlation between a defined state of charge SOC and a defined no-load voltage of the battery OCV, for a given temperature of the battery. These data can be obtained from preliminary testing on such a battery, under different temperature conditions. Thus, at the moment the battery wakes, the measurement of the voltage at the battery terminals is the no-load voltage OCV of the battery, with no current flowing through the battery, and the battery management system 10 can calculate a corresponding state of charge of the battery SOCocv using the measurement of the no-load voltage OCV when the battery wakes and the temperature of the battery.

The initialization method is intended to determine an initial state-of-charge value that is reliable when the battery wakes. In fact, when relaxation of the battery cannot be guaranteed, the state-of-charge value based on measurement of the no-load voltage when the battery wakes is subject to an error caused by relaxation of the battery. Thus, in order to obtain an order of magnitude representative of the error occurring in the no-load voltage measurements taken on the battery on waking, a step for calibrating this error caused by relaxation is implemented, as detailed below.

The error depends notably on the duration of the relaxation periods for the battery in question. Furthermore, relaxation curves are for example drawn for different temperatures, with each curve corresponding to a specific temperature. Preferably, different curves are drawn as a function of whether the relaxation period follows battery charge or discharge polarization.

These relaxation curves at different temperatures are analyzed and target relaxation times Thresh are identified for each temperature.

Furthermore, a maximum error Errmax in the measurement of the no-load voltage caused by incomplete relaxation is also determined. This error is estimated in consideration of the error between the battery voltage on waking for a minimum relaxation time, which corresponds to the minimum time required between a sleep request and a wake request of the battery between two cycles, for example 1 minute, and the battery voltage on waking for the target relaxation time, determined for the measured temperature of the battery. The table below shows an example of a relaxation study carried out at different temperatures to determine the corresponding target relationship times and the maximum error in the measurement of the no-load voltage in consideration of the minimum sleep/wake cycle time of the battery, as explained above.

TABLE 1

| Temperature (T° C.) | Thresh (min) | Err_max (mV) |
|---|---|---|
| 25 | 35 | 7.5 |
| 0 | 95 | 22 |
| −10 | 140 | 30 |

The maximum error in the measurement of the no-load voltage is then converted into an error in the state of charge using an error calculation performed on the map OCV=f (SOC, establishing the correlation between the state of charge of the battery SOC and the waking voltage of the battery, or the no-load voltage of the battery OCV for a given temperature of the battery. This conversion of the maximum error in the measurement of the no-load voltage into an error in the state of charge is preferably performed offline.

FIG. 3 shows the result of this conversion for an example determined maximum error of 50 mV in a value of the waking voltage of the battery. Thus, on the basis of the real map stored for a given temperature OCV=f(SOC), the determined maximum error value is taken into account for each voltage value on battery waking, which provides an upper and lower margin of error for the corresponding state-of-charge value. FIG. 3 describes the calibration curve for the resulting error, showing the variation in this margin of error in the state of charge as a percentage, SOC_error, in relation to the state-of-charge value SOC provided by the map OCV=f(SOC).

Advantageously, this error calibration curve can be broken down into several zones, preferably at least two zones. The calibration curve shown in the example in FIG. 3 has three zones, indicated using reference signs Zone_1, Zone_2 and Zone_3, each corresponding respectively to a predefined range of state-of-charge values. Thus, a state-of-charge value is obtained from the map OCV=f(SOC) for a battery voltage value measured on waking and, as a function of the predefined range of states of charge in which this value falls, the estimated maximum value of the margin of error SOC_error for the predefined state of charge range in question is taken to be the error Err caused by relaxation. According to the example in FIG. 3, for the predefined range of states of charge Zone_1, the error Err caused by relaxation is considered to be 7.5%, for the predefined range of states of charge Zone_2, the error Err caused by relaxation is considered to be 15% and for the predefined range of states of charge Zone_3, the error Err caused by relaxation is considered to be 5%. Thus, taking into account a condition regarding the voltage of the battery on waking, relating to belonging to one of several predefined zones, obviates the need to use a maximum margin of error in the calculation, instead adapting said margin of error as closely as possible to the real margin of error.

FIG. 2 is a flow chart of the method for initializing the state of charge of the battery in relation to the device required for implementation, as described in FIG. 1. Firstly, in a first step E1, the battery management system 10 retrieves the data recorded in the memory 13 as indicated above, i.e. the estimated state of charge of the battery SOCmem on entering sleep mode, the polarization of the battery Signe_Polarisation (charge or discharge) on entering sleep mode, the value of the voltage at the terminals of the battery on waking Ucell, the temperature T of the battery on waking and finally the sleeping time Rest_time.

A second step E2 involves calculating the state of charge SOCocv deduced from the map OCV=f(SOC) for the temperature T of the battery, using the direct measurement of the battery voltage on waking Ucell corresponding to the no-load voltage OCV thereof.

These two steps E1 and E2 constitute an initialization phase. Following this initialization phase, a calibration phase for the error caused by relaxation is implemented according to the principles set out above.

Firstly, in a step E3, the sleeping time Rest_time is compared to the target relaxation time Thresh, resulting from the study of the relaxation of the battery in question for the given temperature T. If the sleeping time Rest_time of the battery is equal to or greater than the target relaxation time Thresh then, in a step E4, the previously calculated state-of-charge value SOCocv is set as the initial state-of-charge value SOCini. In fact, in this case the relaxation time required for the battery to reach steady state has been reached or surpassed, and therefore the voltage value of the battery measured on waking OCV provides a reliable initial state-of-charge value. Furthermore, an access control step to the memory 13 can be implemented in step E3. If the memory is not accessible, the method nonetheless advances to step E4 and the initial state-of-charge value SOCini is set to the calculated state-of-charge value SOCocv, since no other value is available. In other words, if relaxation of the battery is complete or the information stored in memory is not available for any reason whatsoever, the initial state-of-charge value is determined using the calculated state-of-charge value SOCocv.

Conversely, if the memory can be accessed and the sleeping time Rest_time is less than the target relaxation time Thresh, then the method advances to step E5 for calibrating the error Err caused by relaxation. According to the principles set out above, this error is determined using the error calibration curve in FIG. 3 as a function of the battery voltage value on waking Ucell.

Once the error Err caused by relaxation has been determined in step E5, the method advances to a calculation phase for the initial state-of-charge value SOCini. Advantageously, the polarization direction of the battery is taken into account when calculating the initial state-of-charge value. Taking the polarization direction into account helps to get closer to the real state-of-charge value by minimizing over- or under-estimation errors in the state of charge.

Thus, a polarization test is first run in step E6 to determine the polarization direction when entering sleep mode. This test is based on analysis of the variation in battery voltage just after entering sleep mode. A voltage increase at the very beginning of relaxation indicates that battery discharging was interrupted, while conversely a voltage decrease at the very beginning of relaxation indicates that battery charging was interrupted. The variable Signe_Polarisation stored in memory indicates the result of this test. As a function of the polarization direction of the battery provided in step E6 by the variable Signe_Polarisation, a comparison is performed in step E7 between the estimated state of charge of the battery SOCmem that was stored in memory when entering sleep mode and the calculated state of charge SOCocv resulting from the direct measurement of the OCV voltage of the battery on waking. Subsequently, as a function of this comparison, a decision is taken to determine the initial state-of-charge value using the error Err caused by relaxation, as determined in step E5.

If the variable Signe_Polarisation saved in memory indicates that battery discharging (DCH) was interrupted on entering sleep mode, if the estimated state of charge of the battery SOCmem when entering sleep mode is equal to or greater than the calculated state of charge on waking SOCocv (SOCmem>=SOCocv), then the initial state-of-charge value SOCini is determined in step E8 as follows:

$$SOCini = \min(SOCmem, SOCocv + Err).$$

Conversely, but also where battery discharging is interrupted when entering sleep mode, if SOCmem<SOCocv, then the initial state-of-charge value SOCini is determined in step E9 as follows:

$$SOCini = (1-a) \cdot SOCocv + a \cdot (SOCocv + Err),$$

where a is a parameter varying between 0 and 1 representing the sleeping time Rest_time in relation to the target relaxation time Thresh of the battery for a given temperature. More specifically, a=0 if the sleeping time is equal to the target relaxation time and a=1 if the sleeping time is equal to the minimum duration of the battery sleep/wake cycle, for example 1 minute.

Taking account of the actual sleep time in relation to the target relaxation time using the parameter a helps to optimize calculation of the initial value SOCini.

In step E6, if the variable Signe_Polarisation saved in memory indicates that battery charging, rather than battery discharging, was interrupted on entering sleep mode, if the estimated state of charge of the battery SOCmem when entering sleep mode is equal to or less than the calculated state of charge on waking SOCocv (SOCmem<=SOCocv), then the initial state-of-charge value SOCini is determined in step E10 as follows:

$$SOCini = \max(SOCmem, SOCocv - Err).$$

Conversely, but also where battery charging is interrupted when entering sleep mode, if SOCmem>SOCocv, then the initial state-of-charge value SOCini is determined in step E11 as follows:

$$SOCini = (1-a) \cdot SOCocv + a \cdot (SOCocv - Err).$$

in which the parameter a is determined as explained above.

In a variant and in the following examples, the initial state-of-charge value SOCini can be calculated as follows:

Where battery discharging is interrupted on entering sleep mode, if SOCmem<SOCocv, then:

$$SOCini = SOCocv + (SOCocv + Err)/2.$$

Where battery charging is interrupted on entering sleep mode, if SOCmem>SOCocv, then:

$$SOCini = SOCocv + (SOCocv - Err)/2.$$

The method according to the invention therefore enables the state-of-charge value to be brought closer to a more physically realistic value each time said value is initialized, thereby preventing a cumulative error in the state of charge saved in memory.

The invention claimed is:

1. A method for estimating a state of charge of a battery, comprising:
    initializing the state of charge of the battery, including estimating an initial value of the state of charge, the initializing comprising:
        receiving a stored state-of-charge value of the battery when the battery enters sleep mode,
        calculating a state-of-charge value using a measurement of a no-load voltage at terminals of the battery when the battery wakes, and
        calculating an error in the measurement of the no-load voltage due to relaxation of the battery, in which the error is calculated as a function of a current temperature of the battery and a target relaxation time of the battery modeled for each temperature, wherein
    the estimating of the initial value of the state of charge is calculated based on a comparison between the stored values and calculated values of the state of charge and as a function of the calculated error,
    the calculating the error caused by relaxation comprises:
        storing map data correlating a given state of charge with a given no-load voltage of the battery, for a given temperature of the battery,
        determining a maximum error in the measurement of the no-load voltage corresponding to the error between the battery voltage on waking for a minimum relaxation time and the battery voltage on waking for the target relaxation time,
        providing error calibration data describing a variation of a margin of error in the state of charge in relation to a state-of-charge value provided by the map data, as a function of the maximum error,
        designating a plurality of zones within the error calibration data, each of the zones including a predefined range of the state-of-charge values,
        determining a zone of the plurality of zones that includes the state-of-charge value provided by the map data,
        selecting maximum error data describing a maximum value of the variation of the margin of error in the state of charge within the zone, and
        calculating the error caused by relaxation using the no-load voltage measurement when the battery wakes and the error calibration data maximum error data for the zone, and
    the initializing further comprises determining a state of relaxation of the battery on waking.

2. The method as claimed in claim 1, wherein the estimating the initial value of the state of charge is calculated as a function of whether a polarization direction of the battery corresponds to charging or discharging when entering sleep mode.

3. The method as claimed in claim 2, wherein the estimating the initial value of the state of charge is calculated in consideration of a parameter representing the actual sleeping time of the battery in relation to the target relaxation time of the battery.

4. The method as claimed in claim 3, wherein, when the polarization direction corresponds to discharging when entering sleep mode and the stored state-of-charge value (SOCmem) at that instant is equal to or greater than the calculated state-of-charge value (SOCocv) on waking, the estimate of the initial state-of-charge value (SOCini) is calculated as follows:

$$SOCini = \min(SOCmem, SOCocv + Err),$$

otherwise:

$$SOCini = (1-a) \cdot SOCocv + a \cdot (SOCocv + Err),$$

with Err being the calculated error, and the parameter (a) varying between 0 when the sleeping time of the battery is equal to the target relaxation time of the battery, and 1 when the sleeping time of the battery is equal to a minimum time required between a battery sleep request and a battery wake request.

5. The method as claimed in claim 3, wherein, when the polarization direction corresponds to charging when entering sleep mode and the stored state-of-charge value (SOCmem) at that instant is equal to or less than the calculated state-of-charge value (SOCocv) on waking, the estimate of the initial state-of-charge value (SOCini) is calculated as follows:

$$SOCini = \max(SOCmem, SOCocv - Err),$$

otherwise:

$$SOCini = (1-a) \cdot SOCocv + a \cdot (SOCocv - Err),$$

with Err being the calculated error, and the parameter (a) varying between 0 when the sleeping time of the battery is equal to the target relaxation time of the battery, and 1 when the sleeping time of the battery is equal to a minimum time required between a battery sleep request and a battery wake request.

6. The method as claimed in claim 3, wherein, when the polarization direction corresponds to discharging when entering sleep mode and the stored state-of-charge value (SOCmem) at that instant is equal to or greater than the calculated state-of-charge value (SOCocv) on waking, the estimate of the initial state-of-charge value (SOCini) is calculated as follows: SOCini=min(SOCmem, SOCocv+Err), with Err being the calculated error.

7. The method as claimed in claim 3, wherein, when the polarization direction corresponds to charging when entering sleep mode and the stored state-of-charge value (SOCmem) at that instant is equal to or less than the calculated state-of-charge value (SOCocv) on waking, the estimate of the initial state-of-charge value (SOCini) is calculated as follows: SOCini=max(SOCmem, SOCocv−Err), with Err being the calculated error.

8. The method as claimed in claim 2, wherein, when the polarization direction corresponds to discharging when entering sleep mode and the stored state-of-charge value (SOCmem) at that instant is less than the calculated state-of-charge value (SOCocv) on waking, the estimate of the initial state-of-charge value (SOCini) is calculated as follows: SOCini=(SOCocv+(SOCocv+Err))/2, with Err being the calculated error.

9. The method as claimed in claim 2, wherein, when the polarization direction corresponds to charging when entering sleep mode and the stored state-of-charge value (SOCmem) at that instant is greater than the calculated state-of-charge value (SOCocv) on waking, the estimate of the initial state-of-charge value (SOCini) is calculated as follows: SOCini=(SOCocv+(SOCocv−Err))/2, with Err being the calculated error.

10. The method as claimed in claim 1, wherein the error calibration data further describes a variation of a margin of error in the state of charge in relation to a state-of-charge value provided by the map data, as a function of whether the relaxation period follows battery charge or discharge polarization.

11. A management device for a battery, comprising:
processing circuitry configured to initialize a state of charge of the battery, including estimating an initial value of the state of charge, the initializing comprising:
receiving a stored state-of-charge value of the battery when the battery enters sleep mode,
calculating a state-of-charge value using a measurement of a no-load voltage at terminals of the battery when the battery wakes, and
calculating an error in the measurement of the no-load voltage due to relaxation of the battery, in which the error is calculated as a function of a current temperature of the battery and a target relaxation time of the battery modeled for each temperature, wherein
the estimating of the initial value of the state of charge is calculated based on a comparison between the stored values and calculated values of the state of charge and as a function of the calculated error,
the calculating the error caused by relaxation comprises:
storing map data correlating a given state of charge with a given no-load voltage of the battery, for a given temperature of the battery,
determining a maximum error in the measurement of the no-load voltage corresponding to the error between the battery voltage on waking for a minimum relaxation time and the battery voltage on waking for the target relaxation time,
providing error calibration data describing a variation of a margin of error in the state of charge in relation to a state-of-charge value provided by the map data, as a function of the maximum error,
designating a plurality of zones within the error calibration data, each of the zones including a predefined range of the state-of-charge values,
determining a zone of the plurality of zones that includes the state-of-charge value provided by the map data,
selecting maximum error data describing a maximum value of the variation of the margin of error in the state of charge within the zone, and
calculating the error caused by relaxation using the no-load voltage measurement when the battery wakes and the maximum error data for the zone, and
the initializing further comprises determining a state of relaxation of the battery on waking.

12. The management device according to claim 11, wherein the battery is a traction battery of an electric vehicle.

13. A rechargeable hybrid or electric motor vehicle, comprising:
the management device as claimed in claim 11.

14. The management device as claimed in claim 11, wherein the error calibration data further describes a variation of a margin of error in the state of charge in relation to a state-of-charge value provided by the map data, as a function of whether the relaxation period follows battery charge or discharge polarization.

* * * * *